United States Patent
Sarfert et al.

(10) Patent No.: US 6,668,233 B1
(45) Date of Patent: Dec. 23, 2003

(54) METHOD FOR IDENTIFYING THE CONDITION OF AN ENERGY ACCUMULATOR

(75) Inventors: Christel Sarfert, Stuttgart (DE); Eberhard Schoch, Stuttgart (DE); Richard Schoettle, Oelbronn (DE)

(73) Assignee: Robert Bosch GmbH, Stuttgart (DE)

( * ) Notice: Subject to any disclaimer, the term of this patent is extended or adjusted under 35 U.S.C. 154(b) by 46 days.

(21) Appl. No.: 09/890,849

(22) PCT Filed: Nov. 14, 2000

(86) PCT No.: PCT/DE00/04023
§ 371 (c)(1),
(2), (4) Date: Aug. 6, 2001

(87) PCT Pub. No.: WO01/42799
PCT Pub. Date: Jun. 14, 2001

(30) Foreign Application Priority Data

Dec. 8, 1999 (DE) .................................. 199 59 019

(51) Int. Cl.[7] ........................ G01R 31/36; G06F 19/00
(52) U.S. Cl. ........................................................ 702/63
(58) Field of Search ........................ 702/63, 189, 190, 702/65

(56) References Cited

U.S. PATENT DOCUMENTS

| | | | |
|---|---|---|---|
| 4,876,854 A | * 10/1989 | Owens | 60/641.8 |
| 5,321,627 A | * 6/1994 | Reher | 702/63 |
| 5,349,535 A | * 9/1994 | Gupta | 702/63 |
| 5,349,540 A | 9/1994 | Birkle | |
| 5,479,085 A | * 12/1995 | Honda et al. | 320/134 |
| 5,596,260 A | 1/1997 | Moravec | |
| 5,656,919 A | * 8/1997 | Proctor et al. | 320/153 |
| 5,825,156 A | * 10/1998 | Patillon et al. | 702/63 |
| 5,844,884 A | * 12/1998 | Szlenski | 320/149 |
| 5,936,385 A | * 8/1999 | Patillon et al. | 320/136 |
| 6,016,047 A | * 1/2000 | Notten et al. | 320/137 |
| 6,037,777 A | * 3/2000 | Champlin | 324/430 |
| 6,064,180 A | * 5/2000 | Sullivan et al. | 320/132 |
| 6,124,701 A | * 9/2000 | McDowell et al. | 320/132 |
| 6,137,292 A | * 10/2000 | Hirsch et al. | 324/427 |
| 6,167,352 A | * 12/2000 | Kanevsky et al. | 702/81 |
| 6,262,577 B1 | * 7/2001 | Nakao et al. | 324/425 |

FOREIGN PATENT DOCUMENTS

DE 40 14 737 A 11/1990
EP 0 505 333 A2 9/1992

* cited by examiner

Primary Examiner—John Barlow
Assistant Examiner—Demetrius R. Pretlow
(74) Attorney, Agent, or Firm—Michael J. Striker

(57) ABSTRACT

A method for detecting the status of an energy storage means (1) provides that its actual values (2, 3, 4) can be supplied to an estimate routine (5). The actual values (2, 3, 4) can be supplied in a decoupled manner to a model-based parameter estimator (5) and to a filter (7), which are subordinate to a monitoring level (12). Parameterization values (8, 11) obtained are supplied to a predictor (17) that extrapolates the behavior of the energy storage means (1).

12 Claims, 1 Drawing Sheet

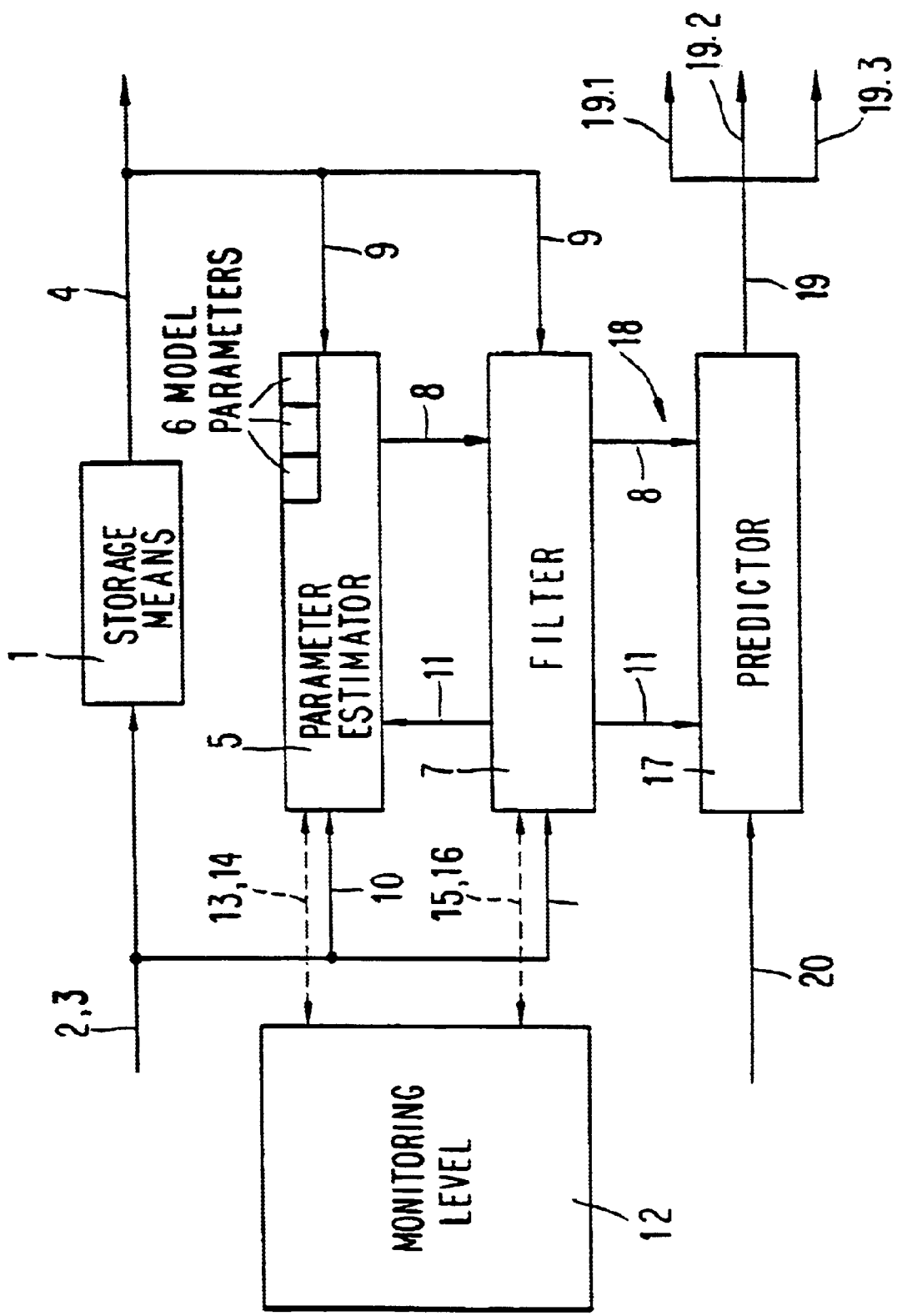

METHOD FOR IDENTIFYING THE CONDITION OF AN ENERGY ACCUMULATOR

TECHNICAL FIELD

If starter batteries, for example, are used as energy storage means in safety-critical consumers, then these energy storage means must be provided with status diagnoses in order to obtain information about whether the energy storage means is still in a position, due to its status, to supply the safety-critical consumer(s) with power or not.

PRIOR ART

In prior embodiments of a battery status detection, attempts were made to obtain reliable information about the charge status of an energy storage means, for example an automotive battery, through the use of heuristic methods such as evaluation of the off-load voltage and current integration. However, it is difficult to capture a complex and nonlinear system such as a starter battery using heuristic methods; a residual uncertainty remains which is intolerable in safety-critical systems. Heuristic methods inevitably involve an uncertainty since these methods cannot come close to including and taking into account all of the influences acting on a complex system. Current integration methods are encumbered with uncertainties because they can involve an incalculable accumulation of measurement errors and as a result no longer fulfill safety criteria that must be met by an energy storage means supplying power to a safety-critical consumer.

EP 0 505 333 A2 has disclosed a model-supported method for status detection and status prediction of an energy storage means. A model-supported status detection method has not previously been used, for example in automotive applications, because the model was too imprecise and the prior estimation algorithms were not sufficiently reliable and comprehensive.

DESCRIPTION OF THE INVENTION

The method proposed according to the invention permits a continuous detection and recognition of actual status values, i.e. of the charge status of an energy storage means. The model-supported battery status detection based on a filter, for example a Kalman filter, and a parameter estimator with on-line parameter identification that has a monitoring level and a predictor, permits a high-precision, very reliable energy storage means diagnosis for safety-critical consumers. The parameter estimation makes it possible to establish model parameters, which change due to defects or due to the aging of the energy storage means, and to continuously adapt the model on which the estimations are essentially based to the actual status and to track this status. The adapted model parameters are transferred to the filter, which is likewise designed based on a model whose estimation values can thus likewise be improved, as a result of which the prediction precision as a whole can be considerably increased. The division of the estimation of status values and parameters—on the one hand by the filter and on the other hand by the parameter estimators—results in the fact that incorrect estimates are prevented or become improbable since the model parameters being entered into the estimation routines and the actual status values of the energy storage means to be queried are always current. Incorrect estimates frequently occur when very large numbers of values have to be simultaneously estimated by the Kalman filter, as in the complex system of an energy storing means.

The parameters can be estimated in the parameter estimator in a different chronological horizon compared to the filter values, which means a reduction of the numerical complexity and therefore an easing of the burden on the processor. The estimation of the parameters by the parameter estimator, however, occurs frequently enough to promptly detect a sudden failure of the energy storage means.

A monitoring level can be used to test the plausibility of the values estimated by the parameter estimator and the filter. The monitoring level can activate the parameter estimator at any time. In terms of hierarchy, the monitoring level has precedence over both estimation routines, the parameter estimator and the Kalman filter. If the estimate values fall outside predefined ranges, the reset function, for example of the filter, can be initiated by the monitoring level.

The estimated values can be supplied to a predictor which, based on the actual status of the energy storage means, extrapolates its status with regard to the load of the safety-critical application. This permits the case, which is to be presumed unfavorable, to be simulated and tested as to whether, when the energy storage means is in a bad state, there is a risk of a possible and imminent failure of the energy storage means.

DRAWINGS

The invention will be explained in detail below in conjunction with a drawing.

FIG. 1 shows the components and routines required for the execution of the method for detecting the status of an energy storage means, as well as their connection to one another.

In the depiction according to FIG. 1, the actual status values of an energy storage means 1, for example the voltage 4, the current 2, and the temperature 3, which the energy storage means 1 is currently subjected to, are respectively supplied as input values 9 and 10 that are decoupled from one another, to a model-based parameter estimator 5 and a model-based model component 7. The filter 7 can, for example, be a Kalman filter. The filter 7 is in a position to estimate the status values by means of a current and voltage measurement of the energy storage means 1 so that these correspond to the actual internal values in the energy storage means 1. This permits quite precise conclusions to be drawn regarding its charge status.

Aging phenomena occurring in the energy storage means 1 or defect-induced changes in the model parameters 6 which form the basis for the estimation model which is implemented in the parameter estimator 5, are taken into account by the filter 7. The filter 7 is supplied with these values decoupled from the parameter estimator. These input values 9 and 10, which are for example the battery voltage, the current, and/or a temperature, are detected continuously and the model parameters 6 are correspondingly adapted so that the estimation model is continuously adapted to the actual status of the energy storage means 1 and the deviations from this actual status are limited to the greatest extent possible. This permits the reliable detection of suddenly occurring energy storage means defects such as short circuits or plate fractures in its cells. These would not be easy for a filter 7 to detect with the required reliability since such defects do not have an immediate effect on the internal status of the energy storage means 1. The model parameters 6 which have been produced based on the input values 9, 10 in the model-based parameter estimator 5 are transferred to the filter 7 by means of a parameter transfer 8. This effectively prevents the evaluation values of the filter 7 from becoming imprecise as a result of excessive model noise. Through the changing of the model parameters 6 in the model-based parameter estimator 5, the likewise model-based filter 7 is made to track the changes occurring in the model of the parameter estimator 5; its model parameters are correspondingly adapted and updated. This system configuration permits abstract models to be developed as learning models which permit a case-specific, adaptive tracking of a model to previously measured and changing influence values.

The decoupled supplying of the input values 9, 10 to the parameter estimator 5 and filter 7 prevents an overtaxing of the Kalman filter 7 so that its estimation values and estimation tendency can be produced in a bias-free manner. Bias-encumbered estimation values occur whenever a large number of values have to be estimated simultaneously by the Kalman filter 7.

The decoupling of the supply of the input values 9, 10 to the parameter estimator 5 and to the filter 7 permits less of a processing burden since the parameter estimator 5 itself still functions reliably in a larger time scheme. The greater time intervals $t_1$ within which the input values 9, 10 can be supplied to the parameter estimator 5 are based on the fact that as a rule, the parameters do not change as fast as the status values 2, 3, or 4 of the energy storage means 1. The interval length $t_1$ reaches its maximal limit, however, in that the estimation of the parameter values must still occur frequently enough that a suddenly occurring defect in the energy storage means 1 can be detected. The monitoring level 12 that has hierarchical precedence over the parameter estimator 5 permits an estimation of the parameters to be executed which is also independent of the interval $t_1$; an estimation of the parameters can take place at any time. In comparison to the estimation interval $t_1$ in the parameter estimator 5, the estimation in the filter 7 takes place at shorter time intervals $t_2$.

In order to prevent an excessive divergence of the estimated value determined by the parameter estimator 5 and the filter 7, the estimation values of the two components 5 and 7 are subjected to a plausibility testing in a monitoring level 12. To that end, the monitoring level 12 is connected to the parameter estimator 5 and the filter 7 via data transfer connections 13, 15. If one estimation value or both estimation values are on an order of magnitude which in this combination, is not possible for plausibility reasons —for example a significantly excessive voltage at extremely low outside temperatures—then the monitoring level 12 initiates a resetting of the estimation values in the parameter estimator 5 and the filter 7 via reset channels 14, 16 and initiates a new estimation. In addition, the estimation values found to be implausible can also be reset to the last plausible estimation values determined.

It can be inferred from the configuration shown in FIG. 1 that the parameter estimator 5 executes a parameter transfer 8 in order to adapt the model data in the filter 7 so that the model stored there corresponds better to the actual circumstances; a status vector 11 determined in the filter 7 is transferred to the parameter estimator 5, whose parameter data 8 for their part influence the model parameters in the Kalman filter 7.

After plausibility tests have been carried out, a predictor 17 is parameterized by the values 8 and 11. The predictor 17 is based on a model that is simpler than the model implemented in the filter 7. The degree of simplification of the model implemented in the predictor 17 depends on which load circumstances of the energy storage means 1 by the safety-critical consumers are to be simulated in the predictor 17. The model implemented in the predictor 17 must be able to reproduce with sufficient precision status values that occur during different—selected or predeterminable—load circumstances in the energy storage means 1. Based on the transmission of the status vector 11 and the parameter transfer 8, which transmission takes place in the context of a parameterization 18, the predictor 17 extrapolates the currently prevailing status of the energy storage means 1 with reference to the load from the safety-critical consumer (s). The load circumstances can be supplied to the predictor 17 as input data—stimuli 20—and then can be played out and simulated in the worst case scenario, whose conditions can be given on a user-specific basis. Based on the model implemented in the predictor 17, information can be obtained as to whether a possible failure of the energy storage means 1 has occurred or not. A starting simulation is mentioned as an example. In the context of a starting routine 19.3, if the predictor 17 can successfully simulate a start at a temperature significantly lower than the currently prevailing temperature 3, then this assures that a failure of the energy storage means 1 need not be feared for the foreseeable future. In the context of a braking routine 19.1, if a successful advance calculation can be made in the predictor 17 that there is enough energy for twenty applications of the service brake, as required by law, then the vehicle can still be safely braked when only the energy storage means 1 can be tapped as an energy source.

In the context of the routines 19.1, 19.2, and 19.3, a hierarchy can also be implemented according to which the individual routines are to be executed. The most important is the braking routine 19.1 when the vehicle is in motion; the energy requirement for this must always be assured; then a steering routine 19.2 is to be executed in order to estimate the assurance of the energy requirement when the vehicle is in motion and to predetermine that the energy storage means 1 can cover this energy need. The starting routine 19.3 is instrumental in starting the engine when the vehicle is not running; if the vehicle is not running, then the routines 19.1 and 19.2 play a more subordinate role since no energy coverage is required for braking and steering maneuvers.

| | |
|---|---|
| 1 | energy storage means |
| 2 | actual value of current |
| 3 | actual value of temperature |
| 4 | actual value of voltage |
| 5 | parameter estimator |
| 6 | model parameter |
| 7 | filter |
| 8 | parameter transfer |
| 9 | input value of voltage |
| 10 | input values of current, temperature |
| 11 | status vector |
| 12 | monitoring level |
| 13 | parameter estimator data exchange |
| 14 | parameter estimator reset channel |
| 15 | data exchange filter |
| 16 | reset channel filter |
| 17 | predictor |
| 18 | predictor parameterization |
| 19 | simulation |
| 19.1 | braking routine |
| 19.2 | steering routine |
| 19.3 | starting routine |
| 20 | stimuli |

What is claimed is:
1. Method for detecting the status of an energy storage means (1), wherein actual values (2, 3, 4) are determined, wherein said actual values (2, 3, 4) are supplied to an estimation routine, characterized in that the estimation routine includes a model-based parameter estimator and a model-based filter (7), wherein the actual values (2, 3, 4) in a decoupled fashion are supplied to the model-based parameter estimator (5) and the model-based filter (7), wherein the model-based parameter estimator (5) and the model-based filter (7) are subordinate to a monitoring level (12), wherein values (8, 11) obtained in the model-based filter (7) impacts a predictor (17) that extrapolates the behavior of the energy storage means (1).

2. The method according to claim 1, characterized in that the model-based parameter estimator (5) includes adaptive model parameters (6), and by means of changes in the actual values (2, 3, 4) of the energy storage means (1), adaptations of the adaptive model parameters (6) of the model-based parameter estimator continuously take place.

3. The method according to claim 1, characterized in that the actual values (2, 3, 4) can be supplied to the model-based parameter estimator (5) as input values (9, 10) in longer time intervals $t_1$.

4. The method according to claim 3, characterized in that the actual values (2, 3, 4) can be supplied to the model-based filter (7) at shorter time intervals $t_2$, where $t_2 < t_1$.

5. The method according to claim 1, characterized in that the values (8, 11) estimated by means of the model-based parameter estimator (5) and the model-based filter (7) are subjected to a plausibility testing in a monitoring level (12) and with non-plausibility, predeterminable conditions are met.

6. The method according to claim 5, characterized in that the monitoring level (12) initializes a resetting (14, 16) of the estimated values (8, 11) and a re-estimation of the values (8, 11) or initiates a resetting of the estimated values (8, 11) to the plausible estimated values that were determined last.

7. The method according to claim 1, characterized in that the plausibility testing of the estimated values (8, 11) takes place on the basis of a predeterminable value range.

8. The method according to claim 1, characterized in that the model-based parameter estimator (5) can be activated at any time by the monitoring level (12).

9. The method according to claim 1, characterized in that the predictor (17) simulates possible loads from a load spectrum based on estimated values (8, 11) from the model-based parameter estimator (5) and the model-based filter (7).

10. The method according to claim 1, characterized in that by means of use-specific stimuli (20), safety critical simulation routines (19.1, 19.2, 19.3) are executed in the predictor (17) in order to predict the behavior of the energy storage means (1).

11. The method according to claim 1, characterized in that input values (9, 10) of the model-based parameter estimator (5) in the model-based filter (7) are accompanied by changes in the model parameters of the model-based parameter estimator (5) by means of parameter transfer (8).

12. Method for detecting the status of an energy storage means (1), wherein actual values (2, 3, 4) are determined, wherein said actual values (2, 3, 4) are supplied to an estimation routine, characterized in that the estimation routine includes a model-based parameter estimator and a model-based filter (7), wherein the actual values (2, 3, 4) in a decoupled fashion are supplied to the model-based parameter estimator (5) and the model-based filter (7), wherein the model-based parameter estimator (5) and the model-based filter (7) are subordinate to a monitoring level (12), wherein values (8, 11) obtained in the model-based filter (7) impacts a predictor (17) that extrapolates the behavior of the energy storage means (1), and wherein the model-based filter (7) is a Kalman filter which estimates the inner status of the energy storage means on the basis of a mathematical model.

* * * * *